United States Patent
Ishikawa

(10) Patent No.: US 8,209,560 B2
(45) Date of Patent: Jun. 26, 2012

(54) TRANSMISSION SYSTEM WHERE A FIRST DEVICE GENERATES INFORMATION FOR CONTROLLING TRANSMISSION AND LATCH TIMING FOR A SECOND DEVICE

(75) Inventor: Toru Ishikawa, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 374 days.

(21) Appl. No.: 12/547,863

(22) Filed: Aug. 26, 2009

(65) Prior Publication Data

US 2010/0058104 A1  Mar. 4, 2010

(30) Foreign Application Priority Data

Aug. 26, 2008  (JP) ................................ 2008-217343
Jun. 24, 2009  (JP) ................................ 2009-149749

(51) Int. Cl.
  *G06F 1/12* (2006.01)
  *G06F 13/42* (2006.01)
  *H04L 7/00* (2006.01)
(52) U.S. Cl. ......... 713/400; 713/500; 713/503; 713/600
(58) Field of Classification Search .................. 713/400, 713/500, 503, 600
  See application file for complete search history.

(56) References Cited

U.S. PATENT DOCUMENTS

| 5,778,214 A * | 7/1998 | Taya et al. ...................... 713/400 |
| 5,864,592 A * | 1/1999 | Itri ................................. 375/375 |
| 6,028,816 A | 2/2000 | Takemae et al. |
| 6,078,623 A * | 6/2000 | Isobe et al. ...................... 375/259 |
| 2007/0300097 A1 * | 12/2007 | Ishikawa ....................... 713/400 |
| 2008/0175343 A1 * | 7/2008 | Nakayama et al. ........... 375/373 |
| 2010/0180143 A1 * | 7/2010 | Ware et al. .................... 713/600 |
| 2010/0271092 A1 * | 10/2010 | Zerbe et al. .................. 327/161 |

FOREIGN PATENT DOCUMENTS

JP  10-228449 A  8/1998

* cited by examiner

*Primary Examiner* — Vincent Tran
(74) *Attorney, Agent, or Firm* — Sughrue Mion, PLLC

(57) ABSTRACT

To provide a semiconductor device including a data input circuit and a data output circuit connected to a plurality of data input/output terminals, where at least one of the data input circuit and the data output circuit fetches data in response to multi-phase clock signals having different phases to be timing signals for fetching data, and adjusts a valid range for fetching data to be substantially uniform for each of the multi-phase clock signals. According to the present invention, the window width of data can be made uniform by individually adjusting the multi-phase clock signals that are input or output timing signals, and thus characteristics of the semiconductor device can be improved.

30 Claims, 15 Drawing Sheets

TRANSMISSION SYSTEM WHERE A FIRST DEVICE GENERATES INFORMATION FOR CONTROLLING TRANSMISSION AND LATCH TIMING FOR A SECOND DEVICE

BACKGROUND OF THE INVENTION

1. Field of the Invention

The present invention relates to a semiconductor device that is a master device and a control method thereof, a semiconductor device that is a slave device and a control method thereof, and a data transmission system between a master device and a slave device and a control method thereof. Particularly, the present invention relates to a memory controller that performs high-speed data transfer to and from a memory in synchronization with a clock and a control method thereof, a memory that performs high-speed data transfer to and from a memory controller in synchronization with a clock and a control method thereof, and a data transmission system that performs high-speed data transfer between a memory controller and a memory and a control method thereof.

2. Description of Related Art

In a conventional data transmission system, connection is provided between a controller as a master device, and a semiconductor device as a slave device by a plurality of wirings formed on a board such as a printed circuit board. Although it is desirable that the wirings have an equal length, connection is realized, in practice, by wirings having mutually different lengths, which results in different signal delays in respective wirings.

Therefore, a method of absorbing the difference of signal delay due to wiring has been proposed by providing an input timing circuit in a signal input circuit of a slave device side, and preliminarily adjusting a phase of a clock supplied to the input timing circuit at a master device side (see Japanese Patent Application Laid-open No. H10-228449, for example).

Data transfer speed in data transmission systems has become increasingly faster in recent years. Along with this trend, internal processing speed of devices has been required to be faster accordingly. However, it is becoming a reality that the device characteristic itself cannot catch up with such speeding up.

Accordingly, there is known a method of temporarily receiving, by a plurality of input circuits in a device, system data that are serially transferred to a data terminal at high speed, converting the serial data into parallel data, and processing the parallel data. With this arrangement, the speed of the data processing becomes slower than the transfer speed of data transfer, and thus the internal processing speed can be moderated. Further, a similar effect can also be achieved, when outputting data, by sequentially outputting parallel data that has been processed within the device from a common data terminal using a plurality of output circuits, that is, outputting the parallel data to a system as serial data.

In such a configuration, it is necessary to provide a plurality of input circuits and output circuits connecting in common to a data terminal within the device, therefore it is necessary to supply a plurality of timing signals having different phases respectively to the input circuits and output circuits. The timing signals, generated within the device, are supplied to the input circuits and output circuits via different wirings formed within the device. Although this configuration results in a difference of delay times due to different wiring lengths, it is not as serious as the system level problem mentioned above, that is, the problem of a signal delay difference based on the difference of lengths of connection between a master device and the slave device (signal lines on a system).

However, although it is small as compared with the difference of delay time in the system, the difference of the amount of signal delay based on the difference of wiring lengths of signal lines within the device cannot be avoided. Particularly, because the timing signals (timing signals having different phases) must have phases that match the high-speed data communication, even a slight signal delay can hinder conversions from serial data to parallel data or conversions from parallel data to serial data.

Japanese Patent Application Laid-open No. H10-228449 does not address the problem of phase shifting of timing signals that must be supplied to an input circuit or an output circuits provided in such a common data terminal. Thus, in practice, it is not possible to deal with the problem using the method of Japanese Patent Application Laid-open No. H10-228449.

SUMMARY

The present invention seeks to solve one or more of the above problems, or to improve upon those problems at least in part.

In one embodiment, there is provided a data transmission system that performs data transmission that includes a first device and a second device, wherein the first device transmits and receives data between the first device and the second device, the first device generates, for the second device, at least one of first information for controlling a first transmission timing at which the second device transmits data to the first device and second information for controlling a first latch timing at which the second device fetches data output from the first device to the second device, and the first device transmits at least one of the first and second information to the second device.

In another embodiment, there is provided a semiconductor device that includes a plurality of first circuits that fetch in parallel a plurality of serial data from an external terminal; an internal clock generating circuit that generates a plurality of first control signals respectively having different phases; and an adjusting circuit that changes respective transition times of the first control signals, wherein the first circuits latches the corresponding serial data at different times, in response to the corresponding first control signals whose transition times have been adjusted by the adjusting circuit, and the adjusting circuit individually changes respective transition times of the first control signals such that a setup time indicating a time from transition of the data input to the first circuit to the corresponding latch, and a hold time indicating a time from the corresponding latch to transition of the data input to the first circuit are respectively the common setup time and hold time in the first circuits.

In still another embodiment, there is provided a semiconductor device that includes a plurality of second circuits that serially output internal parallel data to a single external terminal; an internal clock generating circuit that generates a plurality of second control signals respectively having different phases; and an adjusting circuit that changes respective transition times of the second control signals, wherein the second circuits serially output the corresponding parallel data respectively at different times, in response to the corresponding second control signals whose transition times have been adjusted by the adjusting circuit, and the adjusting circuit individually changes respective transition times of the second control signals such that a valid time of the first data and a valid time of the next data output by the second circuits are set to be equal.

As described above, in the semiconductor device according to the present invention, a timing skew due to wiring delay or the like in multi-phase clock signals can be corrected, because at least any one of an input circuit or an output circuit fetches data in response to multi-phase clock signals having different phases to be timing signals for fetching data, and controls a valid range for fetching data to be substantially uniform for each of the multi-phase clock signals.

Further, conventionally, with regard to input/output circuits of a high-speed interface, a single input/output circuit has a plurality of input/output timing generating circuits, with variations among data window widths. Thus, the input or output timing generating circuit having the smallest window width has limited characteristics of the semiconductor device. However, in the semiconductor device according to the present invention, data window width can be made uniform by individually adjusting the multi-phase clock signals that are input or output timing signals, and thus the characteristics of the semiconductor device can be improved.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Embodiments of the present invention will be explained below in detail with reference to the accompanying drawings. Note that constituent elements in the embodiments can be suitably replaced by existing constituent elements, and many variations including combinations between the constituent elements in the embodiments and existing constituent elements can be made. Therefore, the scope of the present invention described in the appended claims is not limited by the descriptions in the embodiments.

Figure 1:
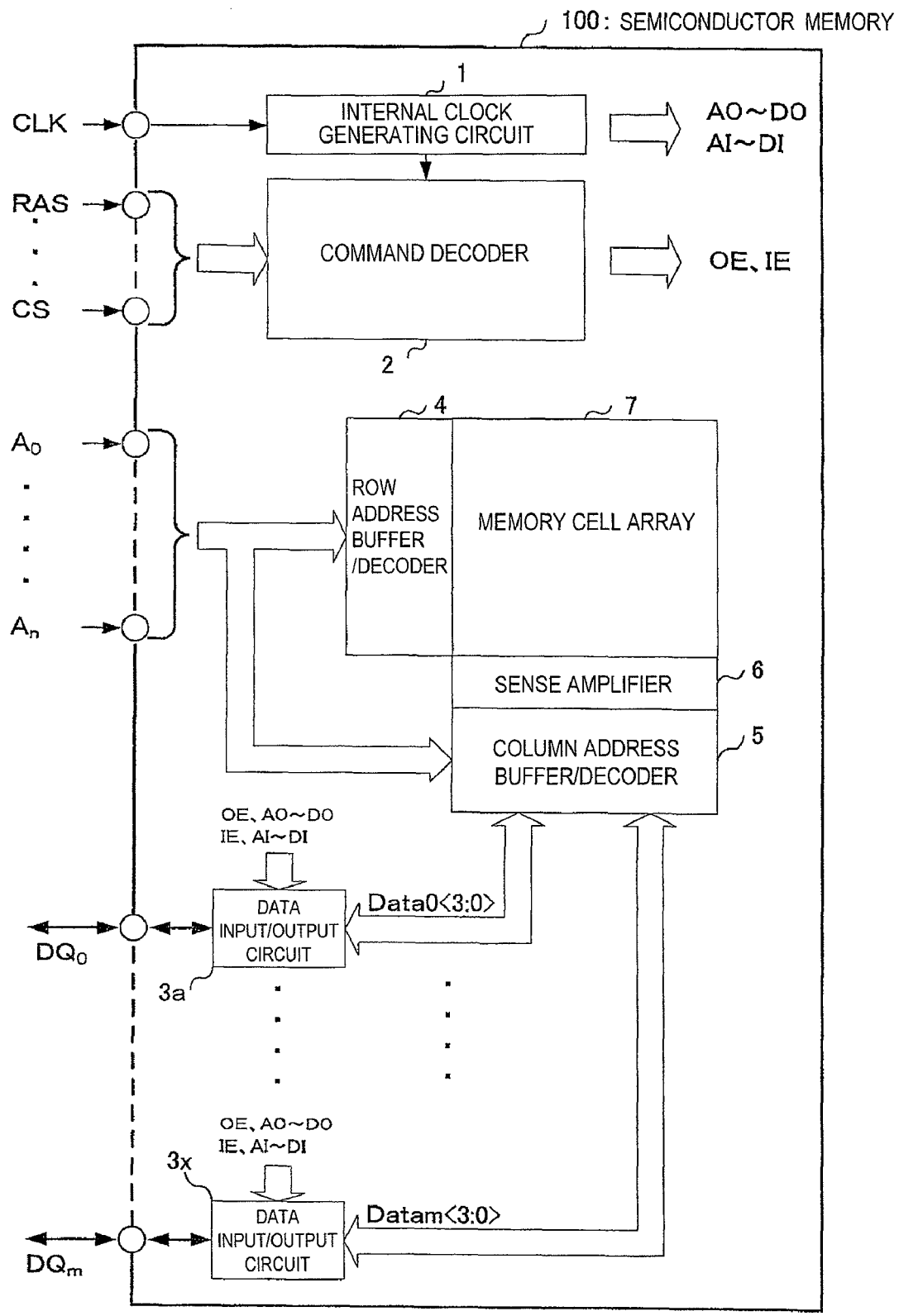
FIG. 1 is a configuration diagram of a semiconductor memory according to a present embodiment.

A semiconductor device according to an embodiment of the present invention is shown in FIG. 1 as a semiconductor memory 100. The semiconductor memory 100 includes an internal clock generating circuit 1 that generates, from an external clock signal (CLK), output timing signals AO to DO and input timing signals AI to DI as multi-phase clocks, and supplies them to a plurality of data input/output circuits 3a to 3x. For example, a plurality of output timing signals AO to DO and input timing signals AI to DI are sequentially generated according to a transition edge (identical time point; a single transition point) of an external clock signal (CLK).

Further, the semiconductor device includes a command decoder 2 that receives a command such a RAS (Row Address Strobe signal), a CAS (Column Address Strobe signal), or a CS (Chip Select) from an external controller, generates an output enable signal OE that defines an active data output period and an input enable signal IE that defines an active data input period, and supplies them to the data input/output circuits 3a to 3x.

The data terminals DQ0 to DQm (first external terminal) transmit and receive data serially between the external controller. The data input via the data terminals DQ0 to DQm are supplied to the data input/output circuits 3a to 3x. For example, 4-bit serial data supplied to the data input/output circuits 3a to 3x are converted into parallel data by the data input/output circuits 3a to 3x, and are output to a column address buffer/decoder 5.

A row address buffer/decoder 4 temporarily stores the received address data A0 to An, and performs a row access, that is, selection of a word line to a corresponding cell in a memory cell array 7, based on the received address data.

The column address buffer/decoder 5 temporarily stores the received address data A0 to An, and performs a column access, that is, selection of a bit line to a corresponding cell in the memory cell array 7, based on the received address data.

A sense amplifier 6 amplifies a very low voltage around several hundred mV, which has been read out to the bit line, to a level that can be handled as digital data. The memory cell array 7 is, for example, a storage circuit block of a plurality of memory cells connected in an array configuration including transistors and capacitors provided at an intersection of a word line and a bit line, where a particular memory cell is selected by the word line, and the data is read and written by the bit line.

Figure 2:
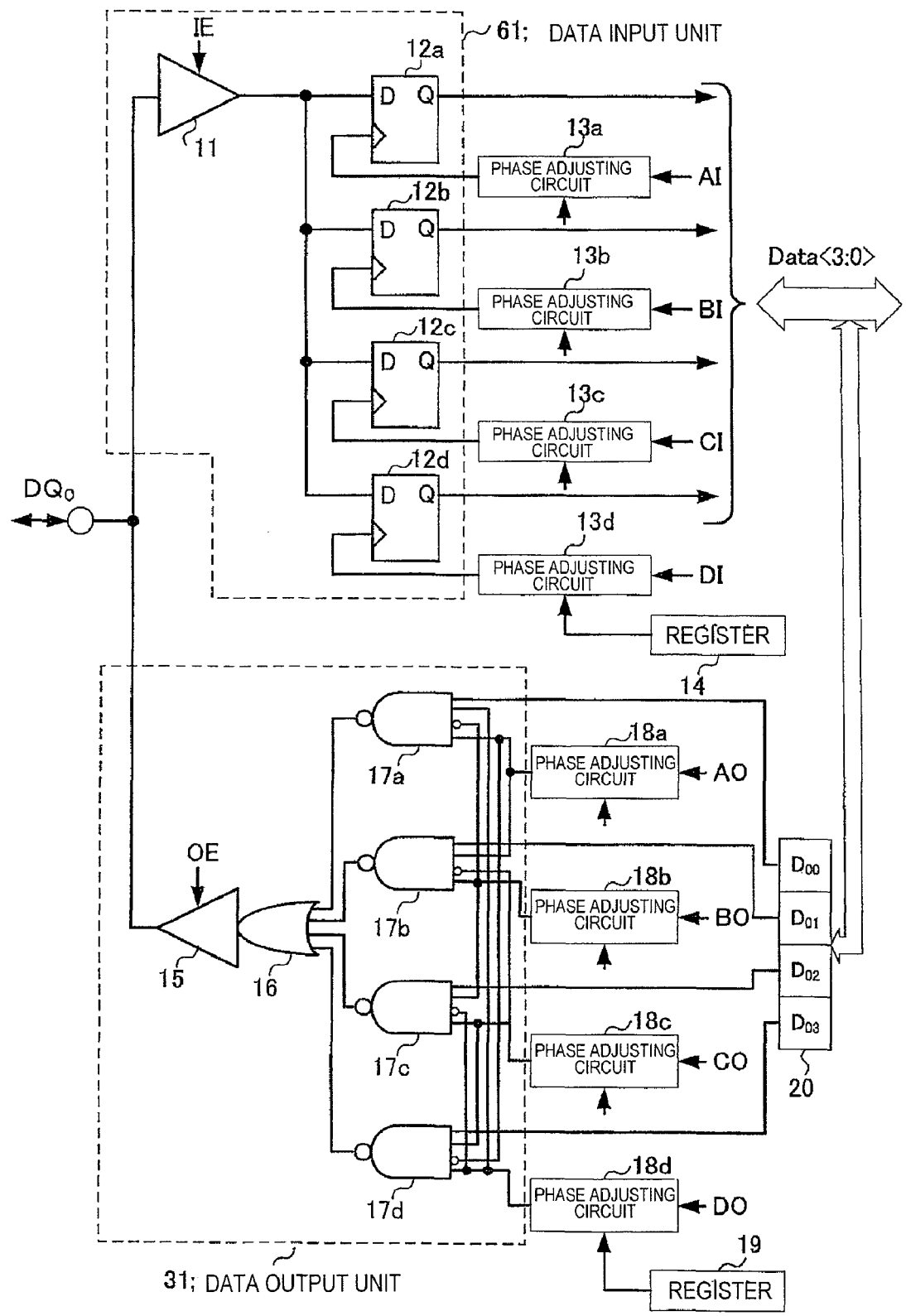
FIG. 2 is an internal configuration diagram of a data input/output circuit according to the present embodiment.

Each of the data input/output circuits 3a to 3x has a data input circuit including a data input unit 61 and a data output circuit including a data output unit 31, as shown in FIG. 2. Specifically, the data input unit 61 includes an input buffer 11 that fetches input data activated by an input enable signal IE supplied from the command decoder 2 and flip-flops 12a to 12d that fetch input data from the input buffer 11, based on the input timing signals AI to DI supplied from the internal clock generating circuit 1 via phase adjusting circuits 13a to 13d. In the present embodiment, the flip-flops 12a to 12d convert, for example, 4-bit serial data into parallel data by fetching data based on the input timing signals AI to DI supplied from the internal clock generating circuit 1.

Figure 7:
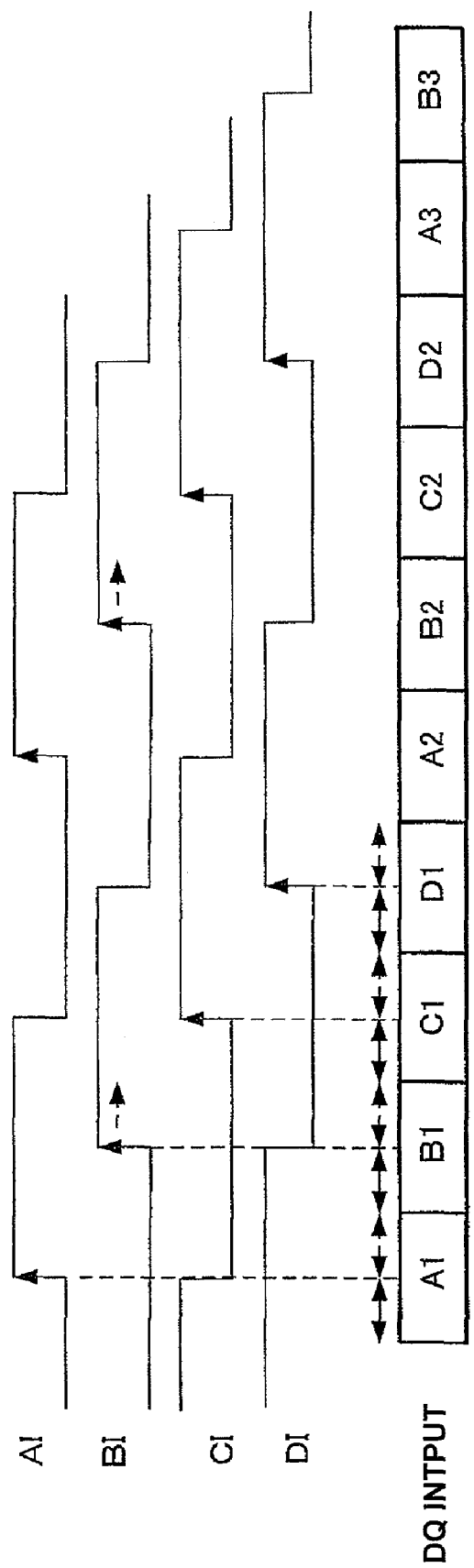
FIG. 7 is a timing chart showing a relationship between four input timing signals and a data input according to the present embodiment.

Further, the internal clock generating circuit 1 provides respective input timing signals AI to DI with a predetermined time delay to supply the input timing signals AI to DI as shown in FIG. 7. Although the four timing signals are shown as timing signals that are multi-phase clocks in the present embodiment, this is only exemplary and the present embodiment is not limited to the four timing signals described above.

The phase adjusting circuits 13a to 13d correct the shift in input timing signals AI to DI, based on data written in a register 14. The register 14 outputs shift information about respective input timing signals AI to DI written from the external controller to the phase adjusting circuits 13a to 13d provided in supply lines of corresponding input timing signals AI to DI.

Meanwhile, the data output unit 31 includes an output buffer 15 that activated by an output enable signal OE supplied from the command decoder 2 to fetches output data, NAND circuits 17a to 17d that receive, via phase adjusting circuits 18a to 18d, input timing signals AO to DO supplied from the internal clock generating circuit 1 and internal data from a latch circuit 20 that temporarily holds internal data D00 to D03 to be output, and an OR circuit 16 that performs an OR operation on the input from the NAND circuits 17a to 17d. Output of the OR circuit 16 is supplied to the output buffer 15. When the output enable signal OE is deactivated, i.e., at the time of data input, output of the output buffer 15 becomes Hi-z (high impedance).

Figure 5:
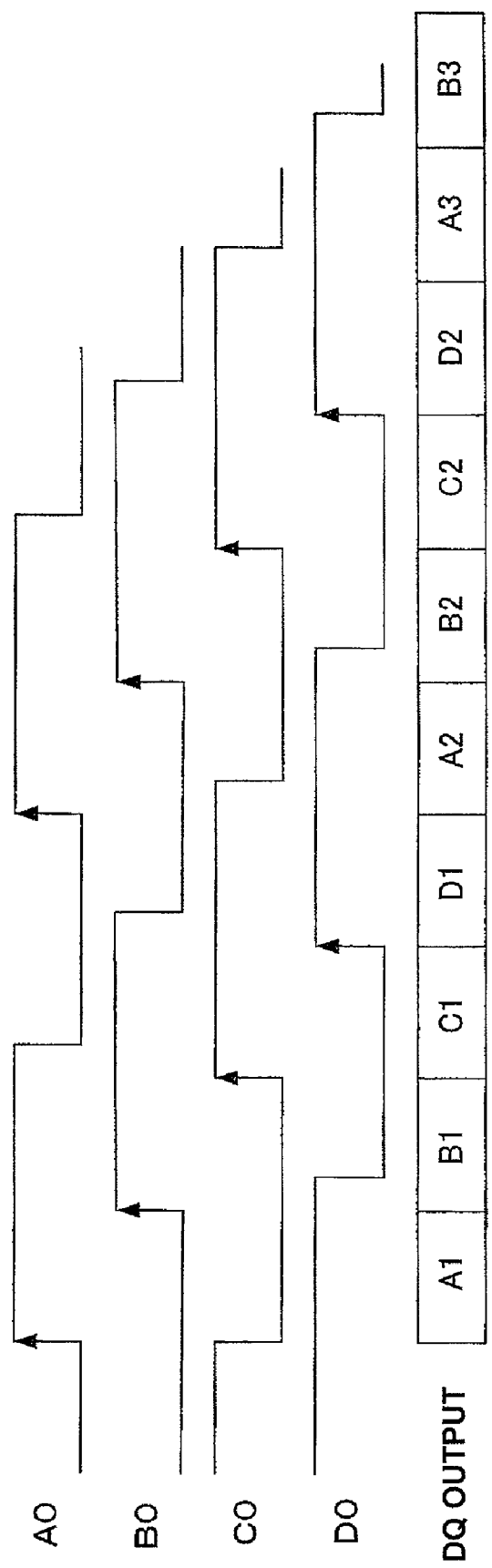
FIG. 5 is a timing chart showing a relationship between four output timing signals and a data output according to the present embodiment.

Further, the internal clock generating circuit 1 provides respective output timing signals AO to DO with a predetermined time delay to generate the output timing signals AO to DO as shown in FIG. 5. Although the four timing signals are shown in the present embodiment as timing signals that are multi-phase clocks, it is only exemplary and the present embodiment is not limited to the four timing signals described above.

Functions of the phase adjusting circuits 18a to 18d and a register 19 are similar to the phase adjusting circuits 13a to 13d provided in the data input circuit and the register 14. That is, the phase adjusting circuits 18a to 18d corrects the shift in output timing signals AO to DO based on the data written into the register 19, and the register 19 outputs the shift information about respective output timing signals AO to DO written from the external controller into the phase adjusting circuits 18a to 18d provided in the supply line of the output timing signals AO to DO.

Figure 3:
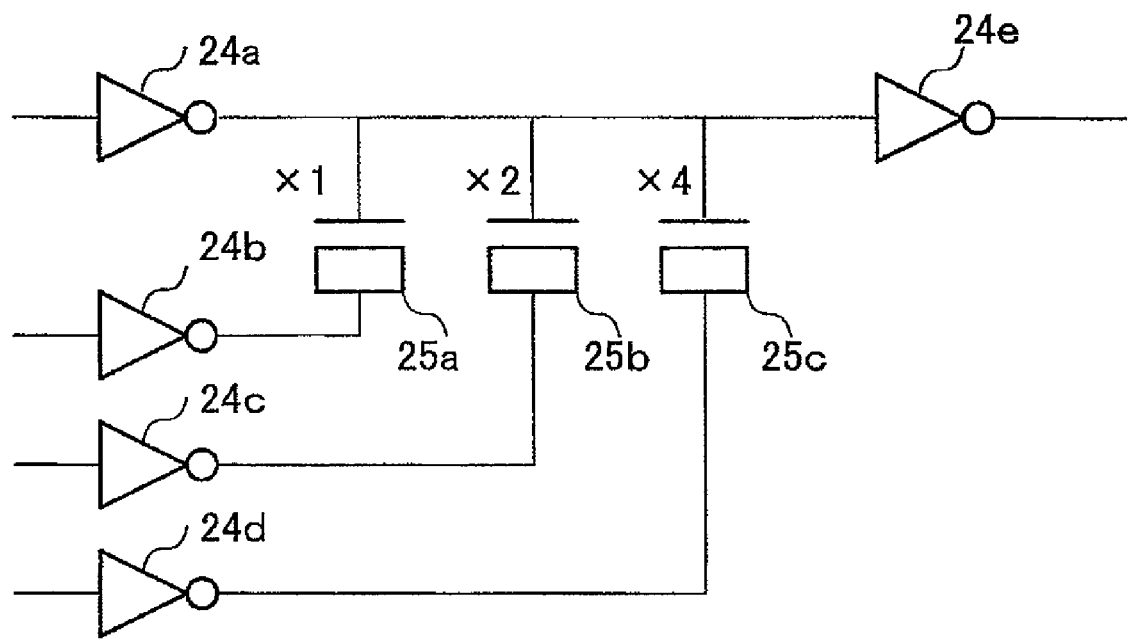
FIG. 3 is an internal configuration diagram of a phase adjusting circuit according to the present embodiment.

The internal circuit of the phase adjusting circuits 13a to 13d, and 18a to 18d includes inverters 24a to 24e, and delay units 25a to 25c, as shown in FIG. 3, where the amount of shift in the input timing signals AI to DI or the output timing signals AO to DO is determined by inputting information that is output from the register 14 or the register 19 into the inverters 24a to 24d. In the example of FIG. 3, adjustment is possible in a range from 0 up to 7 picoseconds.

Figure 4:
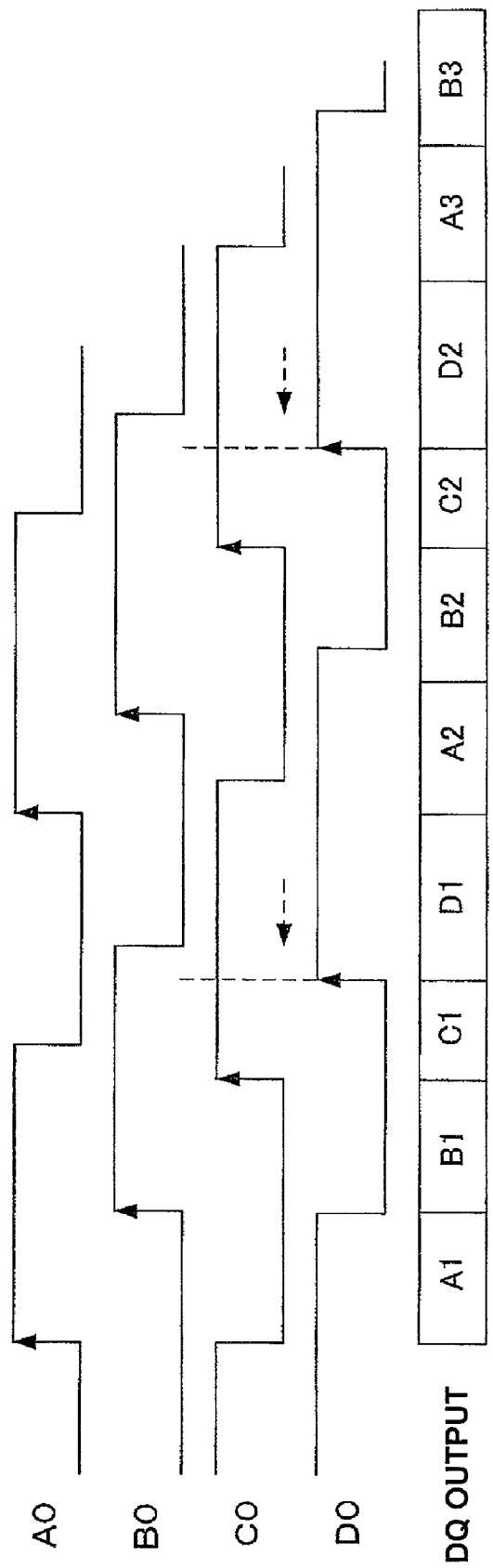
FIG. 4 is a timing chart showing a relationship between four output timing signals and a data output according to the present embodiment.

An operation of the data output circuit is explained with reference to FIGS. 4 and 5. As described above, the difference of the amount of signal delay due to the difference of wiring lengths cannot be avoided. Accordingly, also with the output timing signals AO to DO, there can be a case that a skew occurs in the output timing signal DO as shown in FIG. 4, for example. If, in this case, the data output circuit is driven in this state of timing signal, conversion from parallel data to serial data can be hindered.

That is, if there is a shift such that the phase of the output timing signal DO is advanced than other output timing signals as shown in FIG. 4, the valid range of C1 of the DQ output narrows and the valid range of D1 widens (such a situation occurs periodically, and a similar problem arises with C2 and D2 of the DQ output). Because such a shift in the valid regions (valid windows) of data cannot be adjusted by the controller and generally characteristics of the semiconductor device are determined by the bit data having a characteristic of the narrowest valid region among valid regions (valid windows) of data including a plurality of bits that compose the data, the characteristics of the semiconductor device will eventually worsen and become problematic.

Therefore, for example, the semiconductor memory 100 outputs the DQ output generated in response to the output timing signals AO to DO shown in FIG. 4 to an external device (an external controller 200), detects the output timing signals AO to DO that are producing a shift in the external device and the amount of shift thereof, writes the result of detection into the register 19 in the semiconductor memory 100 as a data stream, and the semiconductor memory 100 controls the valid region (valid window) of the bit data corresponding to respective output timing signals AO to DO respectively by supplying the data stream written into the register 19 to the phase adjusting circuits 18a to 18d, and correcting the output timing signals AO to DO having phase shifts, as shown in FIG. 5. For example, the semiconductor memory 100 controls the edge position (timing of output) for each of the output timing signals AO to DO.

That is, the characteristics of the semiconductor memory 100 according to the present embodiment can be improved by the phase adjusting circuits 18a to 18d that adjusts, based on the information written into the register 19, the shift in four timing signals for outputting data, thereby making the valid regions (valid windows) for outputting data substantially uniform for each of the four timing signals.

In this way, with the semiconductor device (the semiconductor memory 100), the data output circuit (the OR circuit 16, the NAND circuits 17a to 17d, the phase adjusting circuits 18a to 18d, and the register 19) outputs data in synchronization with the multi-phase clock signals having different phases to be timing signals for outputting corresponding data (the timing signals AO to DO generated by the internal clock generating circuit 1), and thus valid regions (valid windows) for outputting data are controlled to be substantially uniform for each of the multi-phase clock signals.

Figure 6:
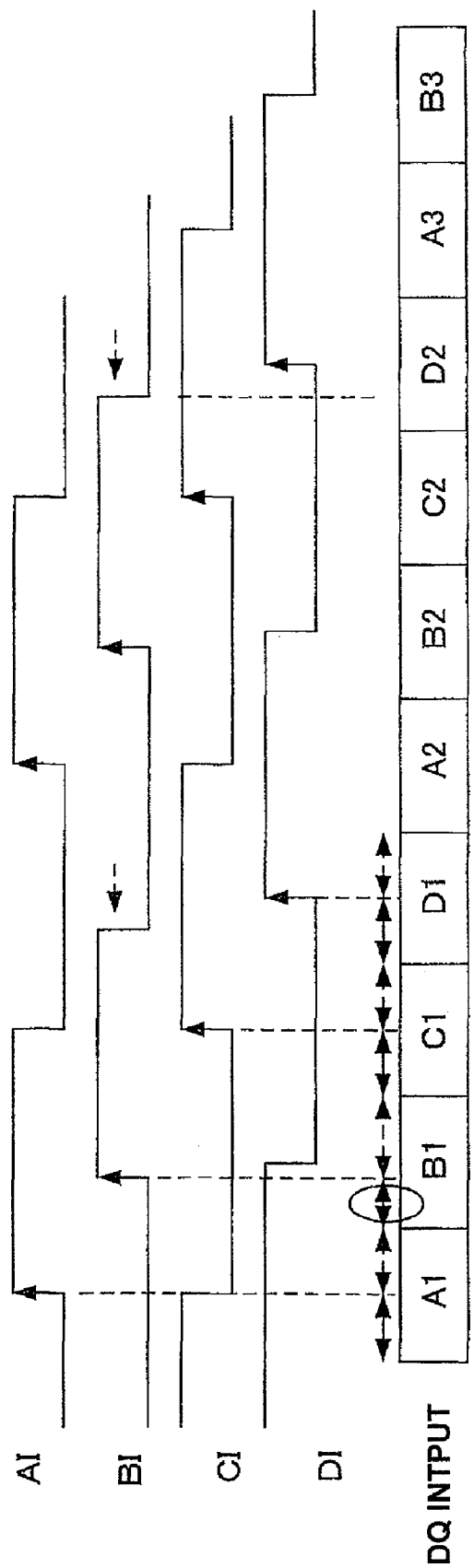
FIG. 6 is a timing chart showing a relationship between four input timing signals and a data input according to the present embodiment.

Further, there is also a case with the data input circuit that a timing shift occurs in the input timing signal BI among the input timing signals AI to DI as shown in FIG. 6, for example, because the difference of the signal delay amount due to the difference of wiring lengths cannot be avoided like the data output circuit. Driving the data input circuit with a timing signal in such a state can hinder conversion from serial data to parallel data.

That is, the margin of a setup time of B1 of the DQ input becomes small if there is a shift such that the phase of the input timing signal BI is advanced than other input timing signals, as shown in FIG. 6. Because such a margin of the setup time or hold time within the semiconductor memory cannot be adjusted by the controller, the characteristics of the semiconductor device will eventually worsen and become problematic. This is because the controller and the semiconductor memory are manufactured by different vendors, respectively and, with regard to the semiconductor memory, ideal timings of the multi-phase clock signals are different for respective semiconductor memories according to respective manufacturing conditions or second sources.

Therefore, for example, the semiconductor memory 100 temporarily fetches DQ input (latches DQ input) into the data input unit 61 (the flip-flops 12a to 12d) in response to the input timing signals AI to DI shown in FIG. 6, and further outputs the fetched data to the external device (the external controller 200), detects the input timing signals AI to DI that are shifted in the external device with the amount of shift thereof, and writes the result of detection into the register 14 in the semiconductor memory as a data stream. The semiconductor memory 100 controls the valid regions (valid windows) for fetching bit data corresponding to respective input timing signals AI to DI by supplying the data stream written into the register 14 to the phase adjusting circuits 13a to 13d, and correcting the input timing signals AI to DI having phase shift, as shown in FIG. 7. For example, the edge position (timing of outputting the input timing signal) for each of the input timing signals AI to DI is controlled. The valid window is also referred to as a setup/hold window.

That is, the characteristics of the semiconductor memory 100 according to the present embodiment can be improved by the phase adjusting circuits 13a to 13d that adjusts, based on the information written into the register 14, the shift in the 4-phase clocks for fetching data, thereby making the valid regions (valid windows) for fetching data substantially uniform for respective 4-phase clocks, as shown in FIG. 7.

As to fetching the data input from the external controller (determination of input data), the semiconductor device (the semiconductor memory 100) thus controls the edge position for each of the multi-phase clock signals to make the valid region for fetching input data substantially uniform for each of the multi-phase clock signals (four timing signals AI to DI generated by the internal clock generating circuit 1).

Figure 8:
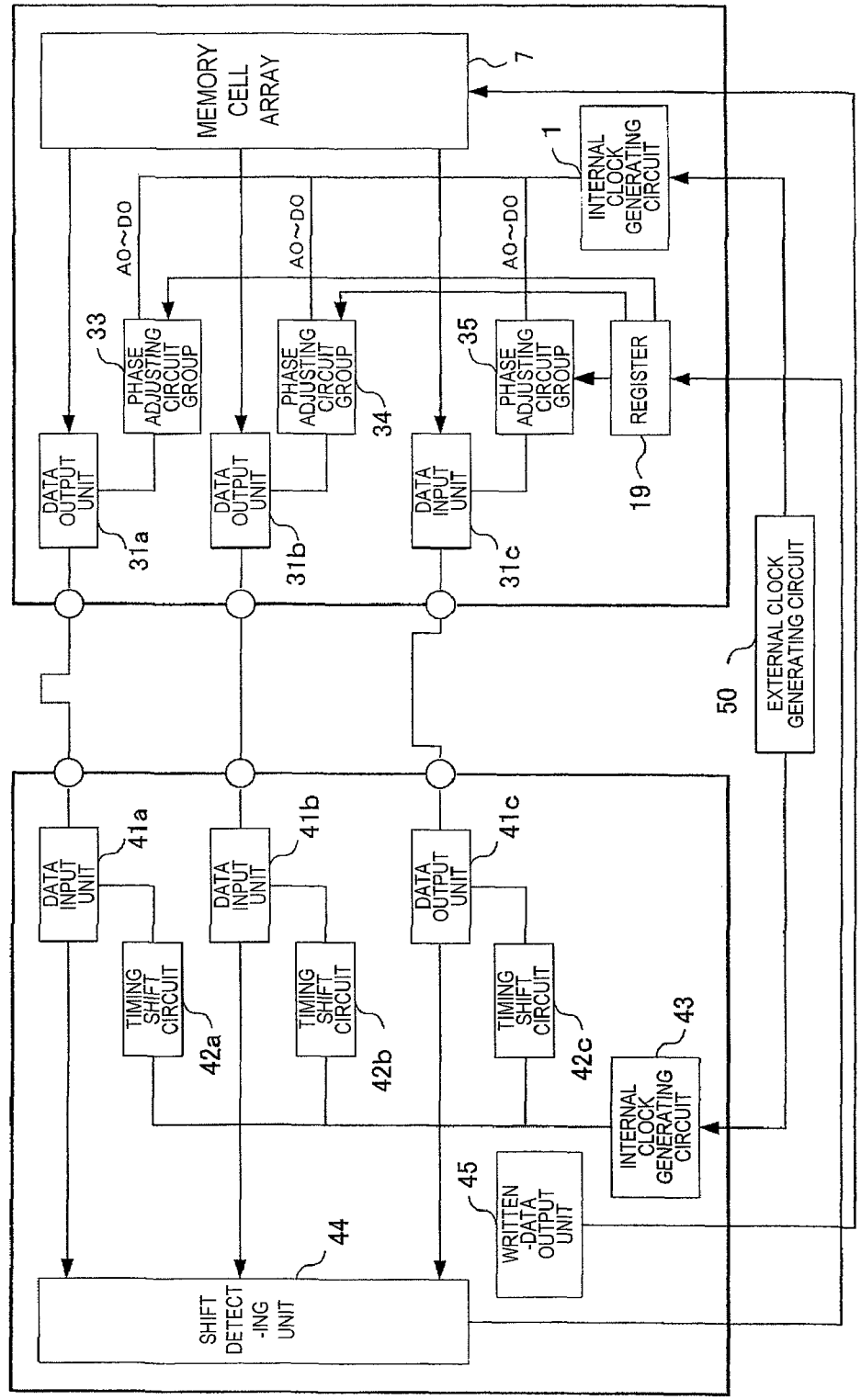
FIG. 8 is a configuration diagram of a system according to the present embodiment.

A data transmission system including the semiconductor memory 100 and the controller 200 is shown in FIG. 8 to explain an adjustment method of the output timing signals AO to DO in detail.

In FIG. 8, the semiconductor memory 100 includes data output units 31a to 31c, phase adjusting circuit groups 33 to 35, the register 19, the internal clock generating circuit 1 and the memory cell array 7. In addition, the semiconductor memory 100 includes an external clock generating circuit 50 that supplies clock signals to the internal clock generating circuit 1.

The data output units 31a to 31c are the same logical circuit block as the data output unit 31 shown in FIG. 2, with the phase adjusting circuit groups 33 to 35 collectively referring to the phase adjusting circuits 18a to 18d, respectively.

To exemplify the data output unit 31a of the semiconductor memory 100, its internal circuit is configured, as shown in FIG. 2, to generate output data by inputting data acquired at the NAND circuits 17a to 17d from the four output timing signals AO to DO and 4-bit data (Data<3:0>) into the OR circuit 16. Of the 4-bit data (Data<3:0>), different data are input, one-bit-at-a-time, into the NAND circuits 17a to 17d. The data are preliminarily written into a predetermined address of the memory cell array from a written-data output unit 45 of the controller 200 shown in FIG. 8 using a low speed serial port.

The relation between the four output timing signals AO to DO and the data output (DQ output) is described with reference to the configuration of the data output unit 31 of FIG. 2 and FIG. 5. The value of DQ output A1 of FIG. 5 is determined by the state of clocks A, B, and D to output a 1-bit data, the value of DQ output B1 is determined by the state of clocks A, B, and C to output a 1-bit data, the value of DQ output C1 is determined by the state of clocks B, C, and D to output a 1-bit data, and the value of DQ output D1 is determined by the state of clocks A, C, and D to output a 1-bit data. The same goes for DQ outputs A2, A3, B2, B3, C2, and D2. The data output unit 31 of FIG. 2 has a waveform with the falling edge of each clock being delayed so that DQ output switches at the rising edge of each clock, whereas DQ output is not switched at the falling edge of each clock.

The four output timing signals AO to DO generated in the internal clock generating circuit 1 are affected by the wiring delay as described above and thus there is a case that shifts occur between the output timing signals AO to DO output from the internal clock generating circuit 1 and respective ideal times thereof, and between the output timing signals AO to DO input to the data output units 31a to 31c and respective ideal times thereof.

Therefore, the phase adjusting circuits 18a to 18d shown in FIGS. 2 and 8 (corresponding to the phase adjusting circuit groups 33 to 35 in FIG. 8) are provided in the supply line of respective output timing signals AO to DO to correct the shift in each the output timing signals AO to DO.

Specifically, the semiconductor memory 100 outputs the output data generated using the four output timing signals AO to DO generated in the internal clock generating circuit 1 to a signal wiring of the system, and the controller 200 receives the output data of the system by data input units 41a to 41c, and a shift detecting unit 44 (verification circuit) of the controller 200 detects the amount of shift in respective output timing signals AO to DO that are signals in the semiconductor memory 100. Subsequently, the shift information is converted into a binary data stream using a conversion table or the like, and the data stream is written into the register 19 in the semiconductor memory 100. The semiconductor memory 100 then supplies the data to the phase adjusting circuits 18a to 18d to correct the shift.

As shown in FIG. 8, the controller 200 includes the data input units 41a to 41c that form a pair with the data output units 31a to 31c of the semiconductor memory 100, timing shift circuits 42a to 42c, an internal clock generating circuit 43, the shift detecting unit 44, and the written-data output unit 45. The data output units 31a to 31c and the data input units 41a to 41c are all connected to the first external terminal. Other external terminals such as a control terminal are not shown in the drawings.

Based on a clock generated in the internal clock generating circuit 43, the timing shift circuits 42a to 42c generates a timing signal for fetching data which is input to the data input units 41a to 41c from the semiconductor memory 100.

The frequency of the clock generated by the internal clock generating circuit 43 is the highest frequency acceptable by the controller 200, specifically a cycle around several picoseconds. The cycle is the minimum unit for correcting the shift in the four output timing signals AO to DO of the semiconductor memory 100.

The shift detecting unit 44 reads the data input based on the timing signal generated by the timing shift circuits 42a to 42c, and detects how large a shift has occurred in which of the output timing signals AO to DO, of the four output timing signals AO to DO of the semiconductor memory 100, by comparing (verifying) the read data with an expected value (data which the written-data output unit 45 has written into the semiconductor memory 100), and determining match (Pass) or unmatch (Fail) of the data. The shift detecting unit 44 converts the detected information into binary information using a conversion table (not shown) or the like, and writes it into the register 19 of the semiconductor memory 100 via an external terminal (second external terminal) (not shown). The second external terminal can be shared with the first external terminal or other control terminals. The number of external terminals can thus be reduced. In the case of sharing with other control terminals, it is preferred to use a control terminal that is used by the memory controller for transmitting other register information to the semiconductor memory.

As initial processing, the written-data output unit 45 writes, with certainty, data stored in a data storage region (not shown) of the controller 200 into the memory cell array 7 shown in FIG. 8, using a low speed serial port. It is desirable to write with a frequency lower than the frequency for reading from the semiconductor memory.

The process of the shift detecting unit 44 is described in detail with reference to FIGS. 4, 5, 9, and 10. First, if there is no shift in respective four output timing signals AO to DO of the semiconductor memory 100, the valid regions of respective DQ outputs becomes uniform as shown in FIG. 5, and data such as shown in FIG. 5 are output to the controller 200 as output data.

On the other hand, when a shift exists in the output timing signal DO of the semiconductor memory 100 as shown in FIG. 4, the valid region of C1 in the DQ output becomes narrower than usual whereas the valid region of D1 becomes wider than usual, because DQ output switches at the rising edge of each clock as described above. In such a state, data are output to the controller 200 as output data.

Figure 9:
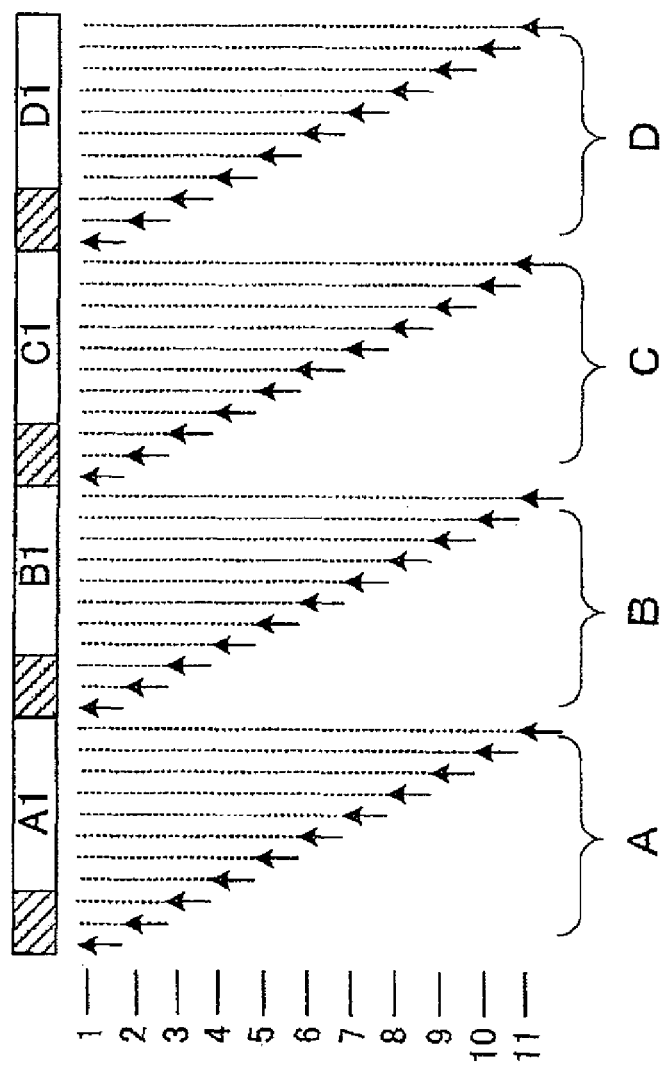
FIG. 9 is a diagram for explaining a method for detecting shifts between four output timing signals.

In the present embodiment, because the controller 200 is preliminarily recognizing that the semiconductor memory 100 generates output data using the four output timing signals AO to DO, the controller 200 divides the data length of the first 4 bits (A1, B1, C1, and D1) of the output data from the semiconductor memory 100 equally into four regions A, B, C, and D, as shown in FIG. 9, by shifting the input timing of the controller 200. The shaded parts of the regions A1, B1, C1, and D1 are indeterminate data regions due to jitter components of DC output, respectively having a same region width.

The timing shift circuits 42a to 42c of the controller 200 provides the data input units 41a to 41c with a read-timing signal that has been shifted by one clock, while corresponding to reference numerals 1 to 11 shown on the left side of FIG. 9, in response to the timing signal output from the internal clock generating circuit 43.

The data input units 41a to 41c simultaneously read data of respective regions (A, B, C, and D), based on the read-timing signal provided by the timing shift circuits 42a to 42c, and output the data to the shift detecting unit 44.

The shift detecting unit 44 determines whether the data input from the data input units 41a to 41c match the expected value and indicates Pass (denoted "P" in FIGS. 9 and 10) if the input data matches the expected value, and Fail (denoted "F" in FIGS. 9 and 10) if the input data does not match the expected value. The expected value is the data output from the written-data output unit 45 of the controller 200.

Therefore, it can be understood that if data having a uniform valid region of each DQ output are input as shown in FIG. 5, the results of determination in respective regions (A, B, C, and D) are all "FFFPPPPPPFF" as shown on the right side of FIG. 9, which is an ideal state without a shift in any of the clocks.

Figure 10:
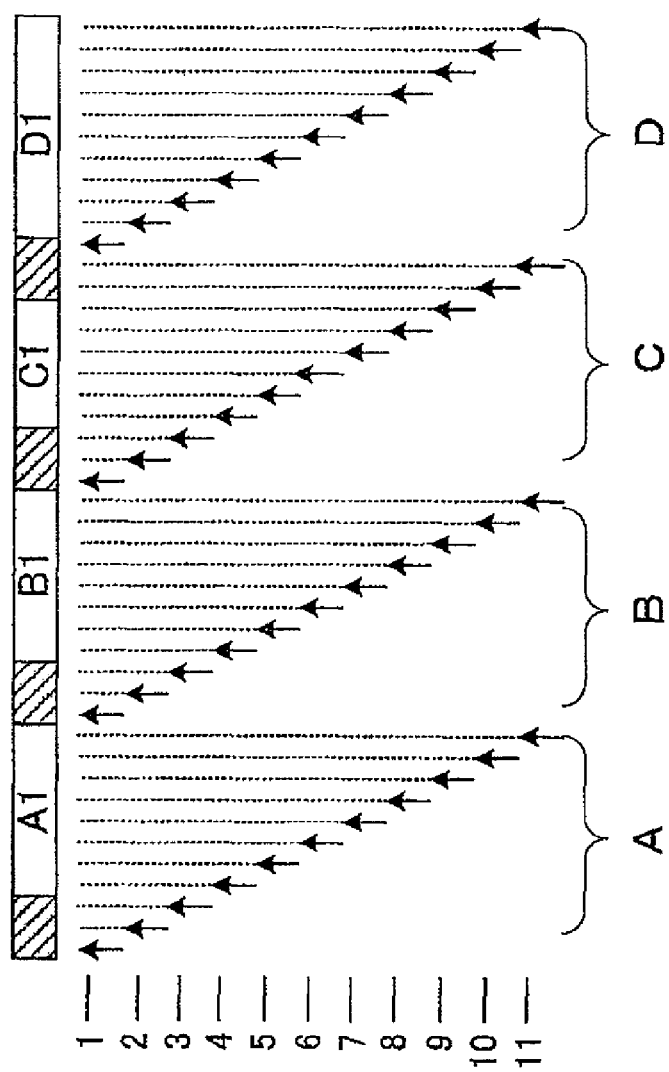
FIG. 10 is a diagram for explaining a method for detecting shifts between four output timing signals.

If, on the other hand, data with a shift in the output timing signal DO such as shown in FIG. 4 are input, the results of determination in respective regions (A, B, C, and D) are "FFFPPPPPPFF" for both A and B, "FFFPPPPFFFF" for C, and "FPPPPPPPPFF" for D, as shown on the right side of FIG. 10.

It can be understood from the above result that the data valid region of "C1" of DQ output and the data valid region of "D1" are different from the data valid regions of "A1" and "B1". Furthermore, as described using FIG. 5, a shift exists in either the output timing signal CO or DO because output timing signals BO, CO, and DO determine the data valid region of "C1", and output timing signals AO, CO, and DO determine the data valid region of "D1".

Further, it can be understood from the determination result of the regions C and D that the data valid region of "C1" is smaller than usual and the data valid region of "D1" is larger than usual. With reference to FIG. 5, because switching of the data valid region of "C1" and the data valid region of "D1" is determined at the rising edge of clock D, it can be understood from the difference of numbers of "Ps" and "Fs" in the determination result that the output timing signal DO rises earlier than usual and the amount of shift is two clock cycles. In practice, a clock having a shift and the amount of shift thereof are instantaneously detected using a determination table or the like in which determination regions are associated with the difference of numbers of "Ps" and "Fs".

In addition, output timing signals AO to DO having a shift and the amount of shift thereof can be detected by performing the above process only on a group of data from the top corresponding to the number of output timing signals, without having to perform the above process on all the input data, regardless of the bit length of data.

Based on the verification result, the shift detecting unit 44 binarizes the information for delaying the output timing signal DO by two clock cycles using a conversion table or the like, and writes the data into the register 19 of the semiconductor memory 100. The phase adjusting circuit 13d of the semiconductor memory 100 supplies data of the register 19 to the inverters 24a to 24d shown in FIG. 3, and delays the output timing signal DO by two clock cycles.

The following matters should be taken into consideration. First, the adjustment information (amount of shift detected by the shift detecting unit) stored in the register 19 includes the shift in the output timing signals AO to DO output by the internal clock generating circuit 1 of the semiconductor memory 100, the shift of the clock output by the internal clock generating circuit 43 of the controller 200 (highest frequency acceptable by the controller 200), and the shift in an each of timing signals of the timing shift circuits 42a to 42c, where a plurality of phase adjusting circuits of the semiconductor memory 100 are respectively adjusted for the total value of the amounts of shifts. Second, the semiconductor memory that outputs data can be referred to as the master device, and the controller that inputs the data can be referred to as the slave device in this example.

As described above, the data transmission system performs data transmission between a master device (the controller 200) and a slave device (the semiconductor memory 100), where the master device and the slave device respectively include a data input circuit or a data output circuit connected to a plurality of data input/output terminals. The data output circuit of the slave device outputs data in response to multi-phase clock signals having different phases to be timing signals for outputting data, and the data input circuit of the master device inputs in response to multi-phase clock signals having different phases to be timing signals for inputting data, the master device compares (verifies) the expected value stored in the master device with the data input via the data input circuit, and analyzes the error, transmits the correction value calculated from the analysis value to the slave device, and the slave device corrects the multi-phase clock signals respectively using the correction value from the master device. In this manner, the value of the valid region (valid window) of each data is controlled to be a relatively identical value in the relation between the master device and the slave device.

Referring to the semiconductor memory that transmits data as the master device and the controller device that inputs data as the slave device, the present data transmission system transmits data between the master device (the semiconductor memory 100) and the slave device (the controller 200), where the master device and the slave device respectively include a data input circuit or a data output circuit connected to a plurality of data input/output terminals. The data input circuit of the slave device corresponding to the data output circuit of the master device outputs and fetches data in response to multi-phase clock signals having different phases to be timing signals for outputting and fetching data, calculates the total value of the amounts of shifts of the multi-phase clock signals of the master device and the multi-phase clock signals of the slave device as a correction value, and adjusts each of the multi-phase clock signals having different phases of the master device, using the correction value. In this manner, the valid regions of respective multi-bit data in the signal of the system become identical.

Further, the shift detector provided in the master device equally divides the data region according to each of the multi-phase clocks, reads data with the input timing of data shifted by a predetermined time interval, detects match or unmatch between the data that has been read in the divided region respectively and an expected value, and specifies the clock signal having a delay and the amount of shift thereof, base on the detected result.

Therefore, the characteristics of the semiconductor device can be improved, because the valid window of the data can be made uniform by adjusting the output timing signals AO to DO individually.

Figure 11:
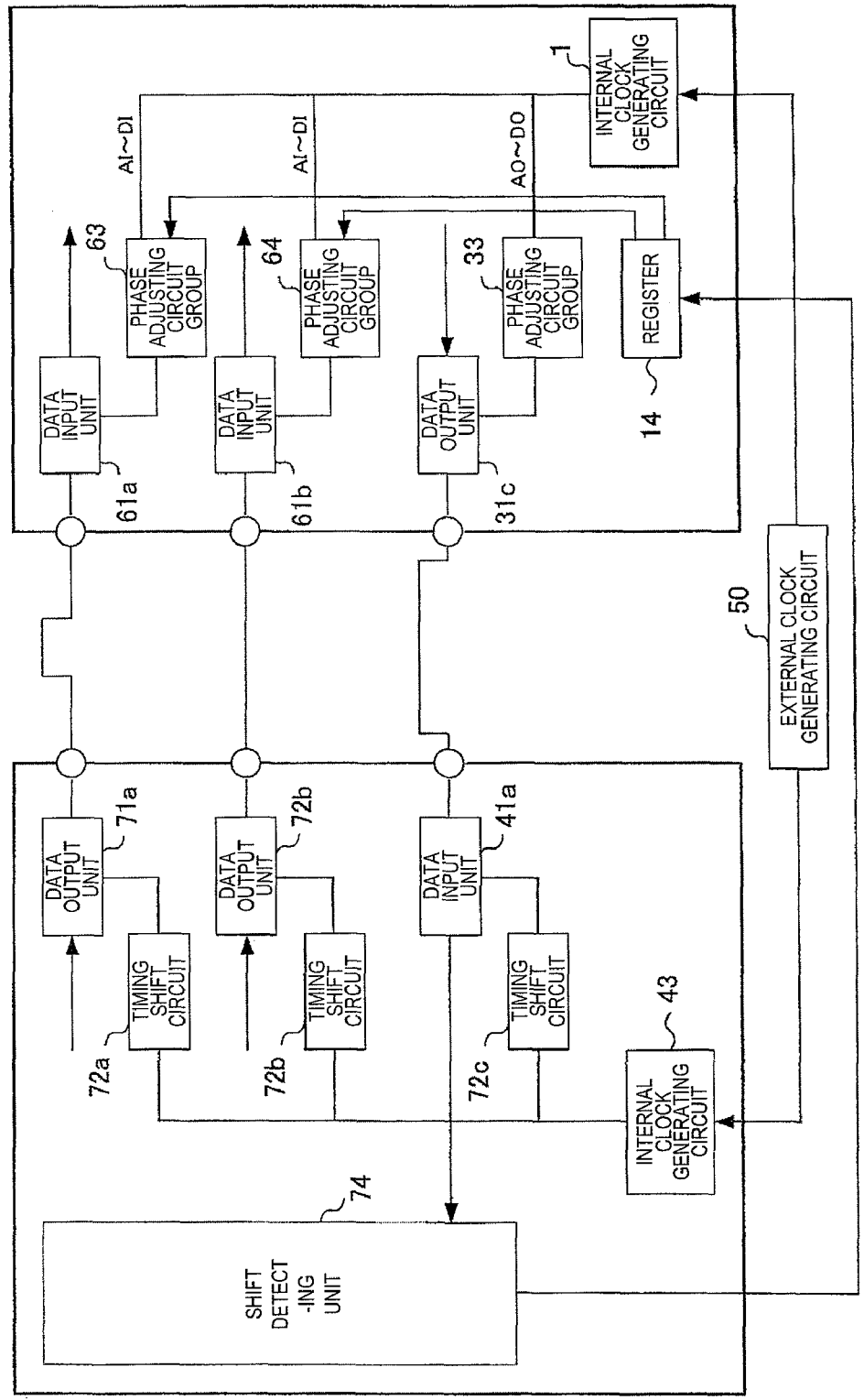
FIG. 11 is a configuration diagram of a data transmission system.

FIG. 11 shows a data transmission system including the semiconductor memory 100 and the controller 200 in order to explain an adjustment method of the input timing signals AI to DI in detail.

In FIG. 11, the semiconductor memory 100 includes data input units 61a and 61b, phase adjusting circuit groups 63 and 64, the register 14, and the internal clock generating circuit 1. In addition, the data transmission system includes an external clock generating circuit 50 that supplies clock signals to the internal clock generating circuit 1.

The data input units 61a and 61b are a plurality of the flip-flops 12a to 12d respectively shown in FIG. 2, with the phase adjusting circuit groups 63 and 64 collectively referring to the phase adjusting circuits 13a to 13d, respectively. Also in the present embodiment, the data which have been input by the data input units 61a and 61b are temporarily returned to the controller 200 in FIG. 11, because the shift in the input timing signals AI to DI is detected by the controller 200. Therefore, the data output unit 31c is shown at the side of the semiconductor memory 100, and the data input unit 41a is shown at the side of the controller 200. The returned data are returned without passing through memory cells (not shown). Specifically, the data are transmitted from the data input unit 61 to the data output unit 31 through the internal data bus Data<3:0> shown in FIG. 2 via the latch circuit 20. Furthermore, it is desirable to adjust the input timing signals AI to DI after adjusting the output timing signals AO to DO as describe above, so that the correction value of the input timing signals AI to DI will not include an error of the output timing signals AO to DO. Alternatively, adjustment of the input timing signals AI to DI can be substituted by operating the output timing signals AO to DO at a low operating frequency. In this substitution, the order of adjusting the output timing signals AO to DO and adjusting the input timing signals AI to DI does not matter. Adjustment of the output timing signals AO to DO and adjustment of the input timing signals AI to DI are performed in a so-called adjustment period (a calibration step) of the system prior to data access.

Taking the data input unit 61a of the semiconductor memory 100 as an example, its internal circuit includes the flip-flops 12a to 12d that fetch input data from the controller 200 using four input timing signals AI to DI, as shown in FIG. 2. The input data supplied from the controller 200 are input to the input end D of the flip-flops 12a to 12d when the input enable signal IE is active. The input data are latched in response to the input timing signals AI to DI supplied through the phase adjusting circuits 13a to 13d, and the fixed data are output from the output end Q.

The relation between the four input timing signals AI to DI and the data (DQ input) input to the input end D of the flip-flops 12a to 12d is explained with reference to the configuration of the data input unit 61 of FIG. 2 and FIG. 7. DQ input A1 of FIG. 7 is fetched at the rising edge of the input timing signals AI, DQ input B1 is fetched at the rising edge of the input timing signal BI, DQ input C1 is fetched at the rising edge of the input timing signal CI, and DQ input end D1 is fetched at the rising edge of input timing signal DI. The same goes for DQ inputs A2, A3, B2, B3, C2, and D2. In FIG. 7, solid lines with arrows on both ends show the setup times of the flip-flops 12a to 12d within the data input unit, and dashed lines with arrows on both ends show the hold times. A marginal time on the left of the edge of each input timing signal is the setup time and marginal time on the right is the hold time. The ideal value of the setup time and hold time is a value being 50% of each.

Similarly to the case of data output, the four input timing signals AI to DI generated in the internal clock generating circuit 1 are affected by wiring delay or the like, and there can be a case that shifts occur between the input timing signals AI to DI output from the internal clock generating circuit 1 and respective ideal times thereof, and between the input timing signals AI to DI input to the data input units 61a, and 61b and respective ideal times thereof.

Therefore, phase adjusting circuits 13a to 13d shown in FIGS. 2 and 11 (shown as the phase adjusting circuit groups 63 and 64 in FIG. 11) are provided in the supply line of respective input timing signals AI to DI to correct the shift in respective input timing signals AI to DI.

Specifically, input data from the controller 200 are fetched in synchronization with the four input timing signals AI to DI generated in the internal clock generating circuit 1. The fetched data is input to the data input unit 41a of the controller 200 shown in FIG. 11, via the data output unit 31c (FIG. 11) that performed the phase adjustment already explained, and the amount of shift in respective input timing signals AI to DI is detected in a shift detecting unit 74 of the controller 200. Subsequently, the information is converted into a binary data stream using a conversion table or the like, the data stream is written into the register 14, which supplies the data to the phase adjusting circuits 13a to 13d to correct the shift.

Meanwhile, as shown in FIG. 11, the controller 200 includes data output units 71a and 71b that form a pair with the data input units 61a and 61b of the semiconductor memory 100, timing shift circuits 72a to 72c, the internal clock generating circuit 43, and the shift detecting unit 74.

The timing shift circuits 72a and 72b generates a timing signal for transmitting data (expected value) input to data output units 71a and 72b to the semiconductor memory 100, based on the clock generated in the internal clock generating circuit 43. The timing shift circuit 72c generates a timing signal for fetching data from the semiconductor memory 100 (device under test) input to the data input unit 41a, based on the clock generated in the internal clock generating circuit 43.

The frequency of the clock generated by the internal clock generating circuit 43 is the highest frequency acceptable by the controller 200, specifically a cycle around several picoseconds. The cycle is the minimum unit for correcting the shift in the four output timing signals AI to DI of the semiconductor memory 100. As described above, the frequency of the phase adjusting circuit groups 33 of the semiconductor memory 100 can be lower than the frequency of the timing shift circuits 72a to 72b, and the phase adjusting circuit groups 63 and 64 of the semiconductor memory 100. In this case, the order of adjusting the output timing signals AO to DO, and adjusting the input timing signals AI to DI does not matter.

The shift detecting unit 74 sequentially fetches a group of data input based on the timing signal generated by the timing shift circuit 72, reads the data and detects how large a shift has occurred in which of the input timing signals AI to DI, of the four input timing signals AI to DI of the semiconductor memory 100 by comparing (verifying) the read data with an expected value, and determining match (Pass) or unmatch (Fail) of the data. This amount of shift also includes the amount of shifts in the timing shift circuits 72a to 72b of the controller 200. The shift detecting unit 74 converts the detected information into binary information using a conversion table (not shown) or the like, and writes the information into the register 14 of the semiconductor memory 100.

The following matters should be taken into consideration. The adjustment information (amount of shift detected by the shift detecting unit) stored in the register 14 includes the shift in the input timing signals AI to DI output by the internal clock generating circuit 1 of the semiconductor memory 100, the shift of the clock output by the internal clock generating circuit 43 of the controller 200 (highest frequency acceptable by the controller 200), and the shift in an each of timing signals of the timing shift circuits 72a to 72c, where a plurality of phase adjusting circuits of the semiconductor memory 100 are respectively adjusted for the total value of the amounts of shifts.

The process of the shift detecting unit 74 is described in detail with reference to FIGS. 6, 7, 12, and 13. First, if there is no shift in respective four input timing signals AI to DI of the semiconductor memory 100, the valid regions of respective DQ outputs are uniform as shown in FIG. 7.

On the other hand, if a shift exists in the input timing signal BI of the semiconductor memory 100, as shown in FIG. 6, the margin of a setup time is small and there is a possibility that correct data cannot be fetched by the flip-flop 12b of the data input unit.

In the present embodiment, because the controller 200 is preliminarily recognizing that the semiconductor memory 100 fetches input data using the four input timing signals AI to DI, the controller 200 divides the observation area into four regions A, B, C, and D, and transmits data to the semiconductor memory 100.

Figure 12:
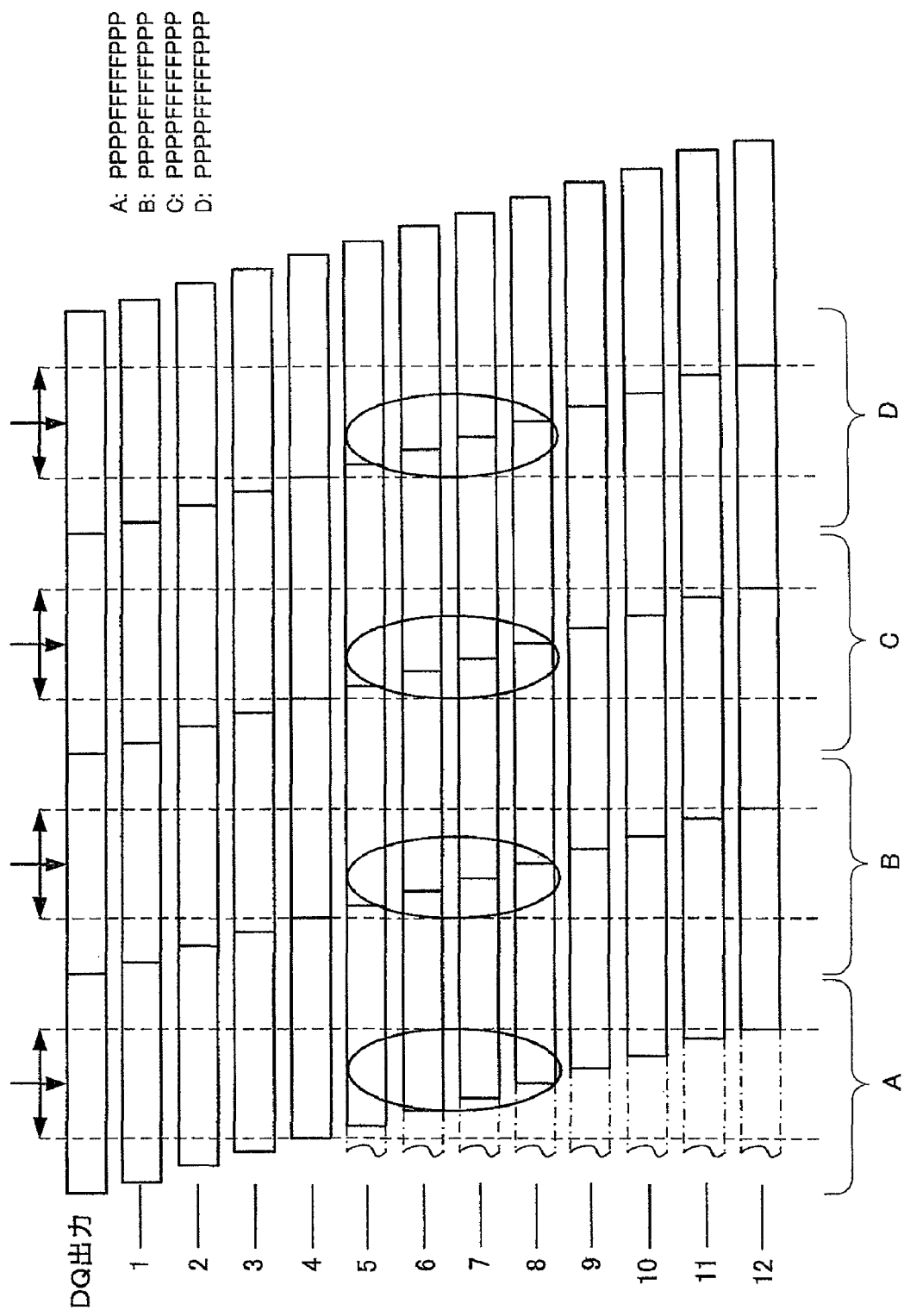
FIG. 12 is a diagram for explaining a method for detecting shifts between four input timing signals.

The timing shift circuit 72a (72b) of the controller 200 provides the data output unit 71a (71b) with an output timing signal that has been shifted by about several picoseconds (one clock cycle), while corresponding to reference numerals 1 to 12 shown on the left side of FIG. 12, in response to the timing signal output from the internal clock generating circuit 43.

The shift detecting unit 74, including a flip-flop, forms a region (determination region) in which the setup time and hold time required for fetching data are provided before and after the data fetch timing (arrow in the drawing) generated by the internal clock generating circuit 1 of the semiconductor memory 100 as shown in FIG. 12, and fetches the input data latched respectively by the data output unit 31c of the semiconductor memory 100 and the data input unit 61a of the semiconductor memory 100 via the data input unit 41a of the controller 200. If the data transit within the determination region, the data become uncertain. The reason that the fetch time (determination region) of the shift detecting unit 74 of the controller 200 is wider than the window of the data input unit 41a of the semiconductor memory 100 is purely for measuring the margin of setup and hold of the semiconductor memory 100.

The shift detecting unit 74 subsequently determines whether the data input from the data input unit 41a match the expected value and indicates Pass (denoted "P" in FIGS. 12 and 13) if the input data matches the expected value, and Fail (denoted "F" in FIGS. 12 and 13) if the input data does not match the expected value.

Therefore, if data are input with the valid regions of respective DQ inputs being uniform as shown in FIG. 7, the results of determination in respective regions (A, B, C, and D) are all "PPPPFFFFFPPP" as shown on the right side of FIG. 12. It can be understood that this is an ideal state without a shift in any of the input timing signals AI to DI.

Figure 13:
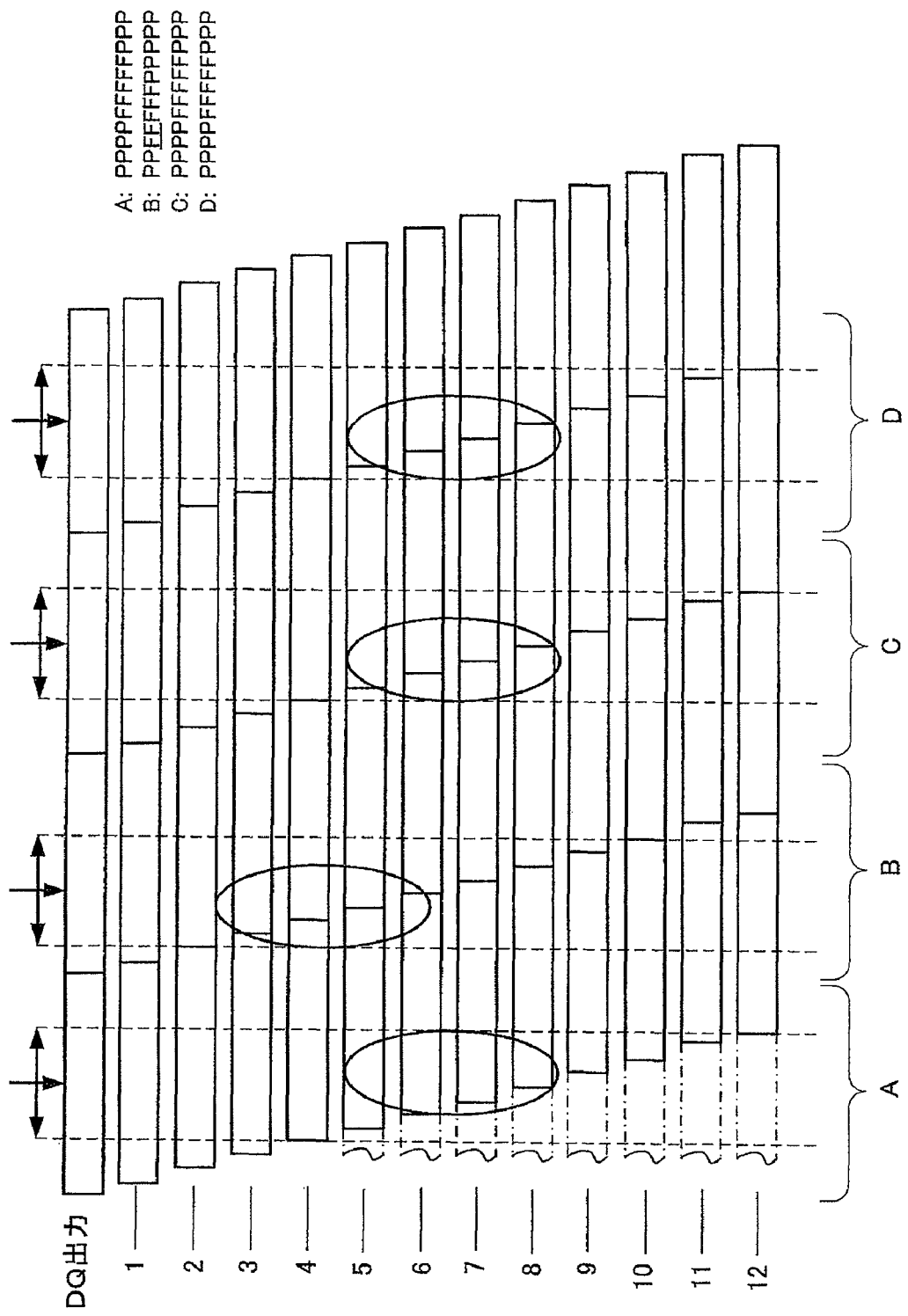
FIG. 13 is a diagram for explaining a method for detecting shifts between four input timing signals.

On the other hand, if data are input with a shift in the input timing signal BI such as shown in FIG. 6, the results of determination in respective regions (A, B, C, and D) are "PPPPFFFFFPPP" for A, C, and D, and "PPFFFFFFFPPP" for B only, as shown on the right side of FIG. 13, because only the determination region corresponding to the shifted input timing signal BI is shifted from the ideal state of FIG. 12.

From the above result, it can be understood that a shift (shift between other input timing signals AI, CI, and DI) exists in the input timing signal BI, and the amount of the shift is two clock cycles from the difference of numbers of "Ps" and "Fs" in the determination result. In practice, a clock having a shift and the amount of shift thereof are instantaneously detected using a determination table or the like having associated the determination region with the difference of numbers of "Ps" and "Fs".

Based on the verification result, the shift detecting unit 74 binarizes the information for delaying the input timing signal BI by two clock cycles using a conversion table or the like, and writes the data into the register 14 of the semiconductor memory 100. The phase adjusting circuit 13b of the semiconductor memory 100 supplies data of the register 14 to the inverters 24a to 24d shown in FIG. 3, and delays the input timing signal BI by two clock cycles.

As described above, the data input circuit of the slave device (the semiconductor memory 100) includes a data input unit (the data input unit 61a or the like) that inputs data from the master device, a multi-phase clock signal generating means (the internal clock generating circuit 1) that generates multi-phase clock signals having different phases to be timing signals for fetching input data from the master device, a storage means (the register 14) that stores the amount of shift for each of the multi-phase clock signals, and a phase adjusting means (the phase adjusting circuit 13a or the like) that controls the edge position for each of the multi-phase clock signals such that the valid range for fetching data becomes substantially uniform for each of the multi-phase clock signals based on the amount of shift for each of the multi-phase clock signals stored in the storage unit. The master device (the controller 200) includes respective units in which the data output means (the data output unit) of the master device (the controller 200) outputs a signal that is sequentially shifted by a very short time (predetermined time interval) to the data input circuit of the slave device, and the shift detecting means (the shift detecting unit 74) of the master device (the controller 200) fetches the input data respectively latched by the data input unit 61a of the semiconductor memory 100 via the data output unit 31c of the semiconductor memory 100 and the data input unit 41a of the controller 200, detect the amount of shift for each of the multi-phase clock signals, and stores the detected amount of shift for each of the multi-phase clock signals.

In addition, the shift detecting means (the shift detecting unit 74) divides the data region equally corresponding to each clock of the multi-phase clocks, shifts the output timing of data from the data output 71a by a predetermined time interval, and reads the data latched by the data input unit 61a of the slave device via the data output unit 31c of the slave device for a plurality of times, and the shift detecting means of the master device (the controller 200) detects match or unmatch between the data that have been read in each of the divided regions and the expected value, and specifies the clock signal with a delay occurring therein and the amount of the shift thereof, based on the detected result.

Because the valid window of data can be made uniform by individually adjusting the multi-phase clock signals, the characteristics of the semiconductor device can be improved. That is, the value of the valid window width is controlled to be relatively the same data (a value of 50% of the setup time and the hold time, respectively), in the relation between the master device (the controller 200) and the slave device (the semiconductor memory 100).

<Modifications>

Figure 14:
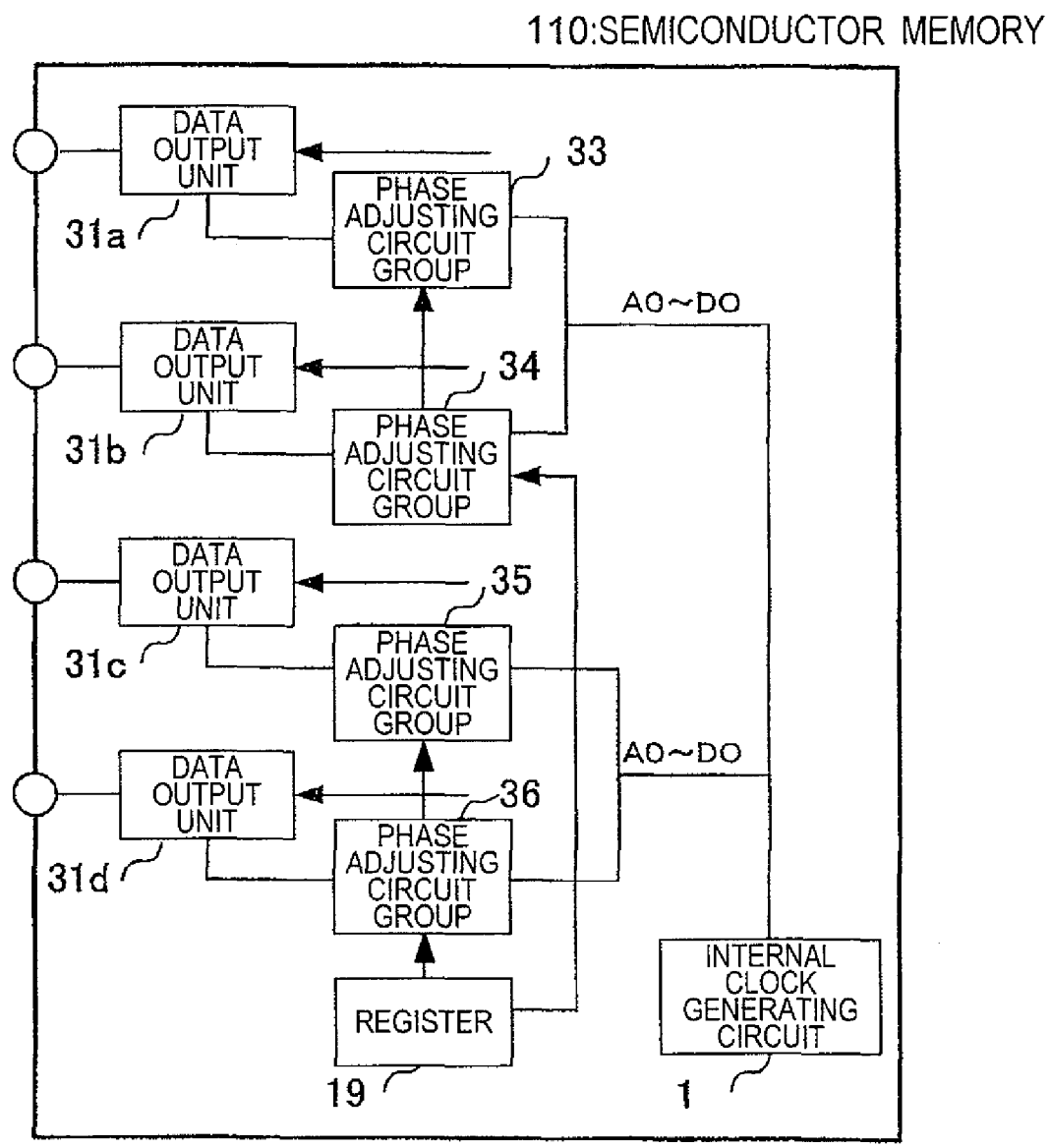
FIG. 14 is a block diagram showing a first modification of the semiconductor memory according to the present embodiment.

FIG. 14 shows a first modification of the semiconductor memory according to the present embodiment. Specifically, in the semiconductor memory 100 described above, output from the register 19 is individually supplied, as shown in FIG. 8, to the phase adjusting circuit composing respective phase adjusting circuit groups 33, 34, 35, and 36. In this modification, however, output from the register 19 is supplied only to the phase adjusting circuits 34 and 36, whereas output from the register 19 is supplied to the phase adjusting circuit groups 33 and 35 from the phase adjusting circuit groups 34 and 36.

That is, as described above, the main cause of shift in the output timing signal is wiring delay as described above and thus, if wiring lengths from the internal clock generating circuit 1 are substantially equal at the data output units 31a and 31b, and substantially equal at the data output units 31c and 31d, wiring delay of the output timing signal can also be regarded as substantially equal. In such a case, a plurality of phase adjusting circuits can share the register value.

In this way, the data output circuit of the slave device includes a multi-phase clock signal generator that generates multi-phase clock signals having different phases to be timing signals for fetching data that have been preliminarily input by the master device, a storage unit that temporarily stores the amount of shift for each of the multi-phase clock signals, and a phase adjuster that adjusts, based on the amount of shift for each of the multi-phase clock signals stored in the storage unit, the valid range for fetching data to be substantially uniform for each of the multi-phase clock signals, and controls the active region for each of the multi-phase clock signals. The data output circuit of the slave device also includes a shift detector that shares the value of the storage unit among a plurality of output circuits of the slave device having a substantially equal wiring length in the data output unit of the slave device and the multi-phase clock signal generator, where the master device inputs data fetched in response to the multi-phase clock signals generated in the multi-phase clock signal generating circuit, detects the amount of shift for each of the multi-phase clock signals, and writes the detected amount of shift for each of the multi-phase clock signals into the storage unit.

Further, the data input circuit of the slave device includes a multi-phase clock signal generator that generates multi-phase clock signals having different phases to be timing signals for fetching input data from the master device, a storage unit that temporarily stores the amount of shift for each of the multi-phase clock signals, and a phase adjuster that adjusts, based on the amount of shift for each of the multi-phase clock signals stored in the storage unit, the valid range for fetching data to be substantially uniform for each of the multi-phase clock signals, and controls the edge position for each of the multi-phase clock signals. The data input circuit of the slave device also includes a shift detector that shares the value of the storage unit among a plurality of input circuits of the slave device having a substantially equal wiring length in the data input unit of the slave device and the multi-phase clock signal generator, where the master device inputs data from the data output unit of the slave device having the valid range for fetching data adjusted to be substantially uniform for each of the multi-phase clock signals, detects the amount of shift for each of the multi-phase clock signals, and writes the detected amount of shift for each of the multi-phase clock signals into the storage unit.

Figure 15:
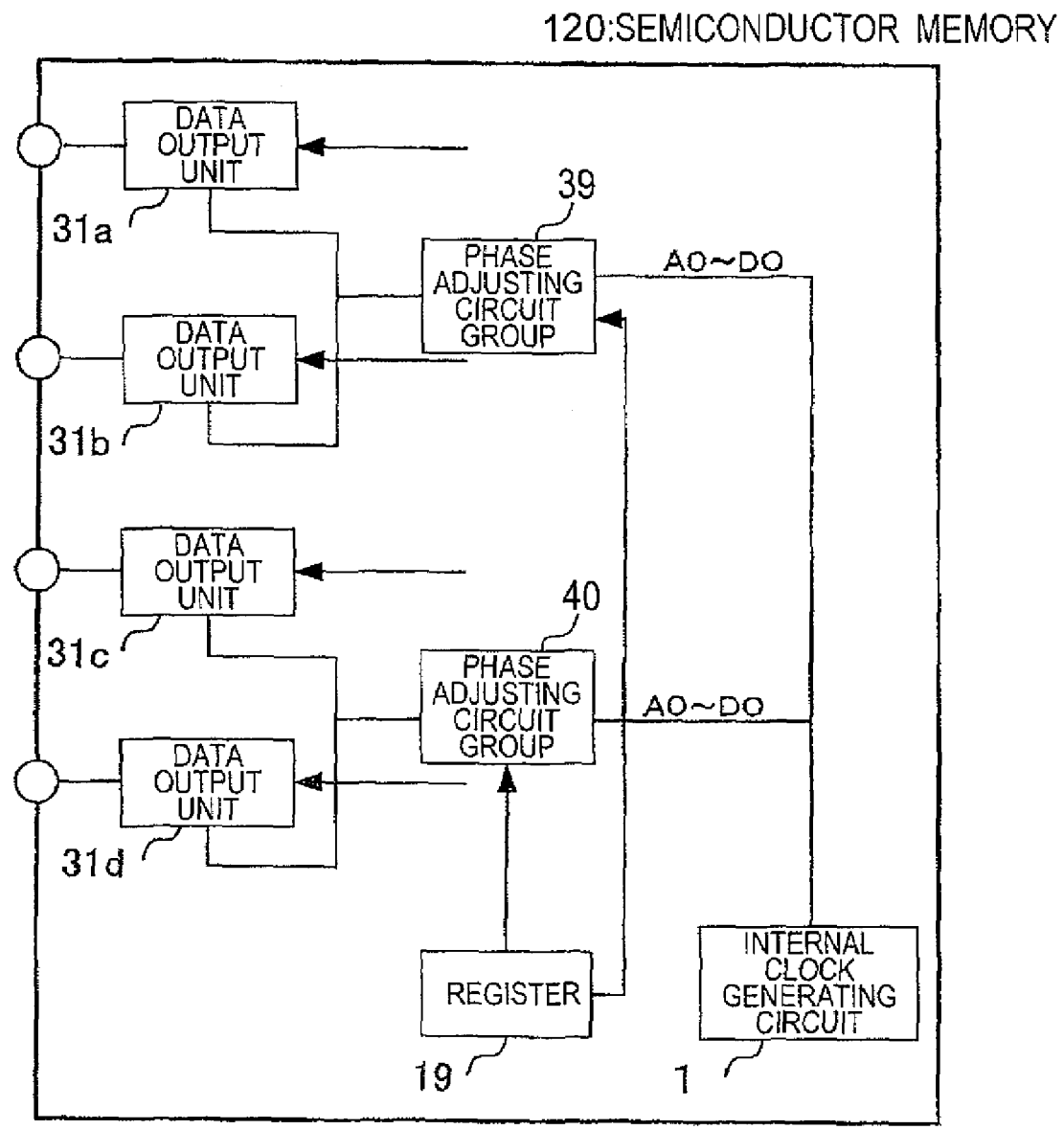
FIG. 15 is a block diagram showing a second modification of the semiconductor memory according to the present embodiment.

FIG. 15 shows a second modification of the semiconductor memory according to the present embodiment. Specifically, in the semiconductor memory 100 described above, output from the register 19 is individually supplied to the phase adjusting circuit composing respective phase adjusting circuit groups 33, 34, 35, and 36. In this modification, however, the data output units 31a and 31b share phase adjusting circuit groups 39, and the data output units 31c and 31d share phase adjusting circuit groups 40.

That is, the main cause of shift in the output timing signal is wiring delay as described above and thus, if wiring lengths from the internal clock generating circuit 1 are substantially equal at the data output units 31a and 31b, and substantially equal at the data output units 31c and 31d, wiring delay of the output timing signal can also be regarded as substantially equal. In such a case, a plurality of data output units can share only the register value of the register 19 but also a phase adjusting circuit.

In this way, the data output circuit of the slave device includes a multi-phase clock signal generator that generates multi-phase clock signals having different phases to be timing signals for fetching data that have been preliminarily input by the master device, and a storage unit that temporarily stores the amount of shift for each of the multi-phase clock signals. The data output circuit of the slave device also includes a shift detector that shares, among a plurality of output circuits of the slave device having a substantially equal wiring length at the data output unit of the slave device and the multi-phase clock signal generator, the value of the storage unit together with a phase adjuster that adjusts, based on the amount of shift for each of the multi-phase clock signals stored in the storage unit, the valid range for fetching data to be substantially uniform for each of the multi-phase clock signals to control the active region for each of the multi-phase clock signals, where the master device inputs data fetched in response to the multi-phase clock signals generated in the multi-phase clock signal generating circuit, detects the amount of shift for each of the multi-phase clock signals, and writes the detected amount of shift for each of the multi-phase clock signals into the storage unit.

Further, the data input circuit of the slave device includes a multi-phase clock signal generator that generates multi-phase clock signals having different phases to be timing signals for fetching input data from the master device, and a storage unit that temporarily stores the amount of shift for each of the multi-phase clock signals. The data input circuit of the slave device also includes a shift detector that shares, among a plurality of input circuits of the slave device having a substantially equal wiring length at the data input unit of the slave device, and the multi-phase clock signal generator, the value of the storage unit together with a phase adjuster that adjusts, based on the amount of shift for each of the multi-phase clock signals stored in the storage unit, the valid range for fetching data to be substantially uniform for each of the multi-phase clock signals, and controls the edge position for each of the multi-phase clock signals, where the master device inputs data from the data output unit of the slave device having the valid range for fetching data adjusted to be substantially uniform for each of the multi-phase clock signals, detects the amount of shift for each of the multi-phase clock signals, and writes the detected amount of shift for each of the multi-phase clock signals into the storage unit.

Therefore, according to the above modifications, internal configuration of the memory can be simplified by sharing circuits or the like.

The disclosure of the present invention described above can be applied as follows. For example, at step 1, the 4-phase clocks (a plurality of first control signals) are respectively corrected in order to adjust the timing of setup/hold of each signal input circuit in the slave device described above. At step 2, the 4-phase clocks (a plurality of second control signals) are respectively corrected in order to adjust the timing of each output of the signal output circuit in the slave device. At step 3, signals are adjusted between devices corresponding to respective distances between a plurality of slave devices and the master device by adjusting the internal timing of the master device. After completion of steps 1 to 3, normal communication is performed between the master device and the slave device corresponding to the address of a system. Steps 1 to 3 are signal adjustment steps (calibration period) prior to normal communication. The order of steps 1 to 3 is not limited to this example. The application of steps 1 and 2 can further enhance reliability of communication data between the master device and the slave device. Specifically, for example, also in a case that four data corresponding to transition of a clock signal are associated therewith, the valid time of the four data and the setup/hold time become substantially equal. This is because correction of plural control signals respectively controlling the four serial data is individually performed by steps 1 and 2.

While an exemplary embodiment of the present invention has been explained above with reference to the drawings, specific configurations of the present invention are not limited to the embodiment, and other designs or the like within the scope of the present invention are also included in the invention. For example, in the above embodiment, although initial processing has been exemplified as the timing of adjusting the shift of the clock, the adjustment can be performed in a test mode. Additionally, although a method of detecting the amount of shift of the timing signal at the controller has been exemplified, its function can be provided at a semiconductor memory side.

What is claimed is:

1. A data transmission system that performs data transmission, comprising a first device and a second device,
    wherein the first device transmits and receives data to/from the second device,
    the first device generates at least one of first information for controlling a first transmission timing at which the second device transmits data to the first device and second information for controlling a first latch timing at which the second device fetches data output from the first device to the second device,
    wherein the first device transmits at least one of the first and second information to the second device,
    wherein the first and second information control a plurality of control signals respectively corresponding to a plurality of the data,
    wherein the control signals have different phases with respect to a single transition point of an external clock signal, and
    wherein, the plurality of data are serial data corresponding to the control signals.

2. The data transmission system as claimed in claim 1, wherein a phase of at least one of the control signals is corrected based on the first information, and respective valid times of the serial data are controlled to be an equal time.

3. The data transmission system as claimed in claim 1, wherein a phase of at least one of the control signals is corrected based on the second information, and the first latch timings corresponding to respective valid times of the serial data are all controlled to be an equal time.

4. The data transmission system as claimed in claim 3, wherein a phase of at least of the control signals is corrected based on the second information such that each setup time indicating a time from each transition of the serial data to the corresponding first latch timing, and each hold time indicating a time from the corresponding first latch timing to a next transition become constant in respective data.

5. A data transmission system that performs data transmission, comprising a first device and a second device, wherein the first device transmits and receives data to/from the second device,
    wherein, the first device generates at least one of first information for controlling a first transmission timing at which the second device transmits data to the first device and second information for controlling a first latch timing at which the second device fetches data output from the first device to the second device,
    wherein the first device transmits at least one of the first and second information to the second device, and
    wherein the first and second information are transmitted during a calibration period of the data transmission system.

6. The data transmission system as claimed in claim 5, wherein the first information includes correction information indicating an error of a second transmission timing at which the first device transmits data to the second device, and
    wherein the second information includes correction information indicating an error of the second latch timing at which the first device fetches data output by the second device.

7. A data transmission system that performs data transmission, comprising
    a first device, a second device, and a first signal line connected between the first and second devices and transmits a plurality of serial data, wherein
    each of the first and second devices includes:
    a plurality of first circuits that fetch in parallel a plurality of serial data transmitted on the first signal line;
    a plurality of second circuits that transmit parallel data in respective devices as the plurality of serial data to the first signal line; wherein
    each of the first circuits is controlled by an associated one of a plurality of first control signals having different phases;
    each of the second circuits is controlled by an associated one of a plurality of second control signals having different phases;

the second device further includes a verification circuit that is connected to the corresponding first circuit and verifies the plurality of data and expected-value data corresponding thereto, and the first device further includes an adjusting circuit that individually changes respective transition times of a plurality of control signals of either the first control signals or the second control signals, according to a result of the verification, wherein the adjusting circuit controls a timing of determining respective inputs of the plurality of data or time widths of respective valid data so as to be equal in the first and second circuits respectively of the first and second devices.

8. The data transmission system as claimed in claim 7, wherein each of the first and second devices further includes an internal clock generating circuit that generates the first control signals and the second control signals respectively having different phases, corresponding to a single transition point of an external clock signal.

9. The data transmission system as claimed in claim 8, wherein the frequencies of the first control signal of the first device and the second control signal of the second device are identical frequencies, and the frequencies of the second control signal of the first device and the first control signal of the second device are identical frequencies.

10. The data transmission system as claimed in claim 9, wherein the frequency of the first control signal of the first device is higher than frequency of the second control signal of the first device, and the frequency of the second control signal of the second device is higher than the frequency of the first control signal of the second device.

11. The data transmission system as claimed in claim 7, wherein the verification circuit changes a time in which the second circuits of the first device respectively output data to the first signal line, and compares each of the plurality of data input from the first signal line by the first circuits of the first device via the first circuits and the second circuits of the second device with a corresponding expected value.

12. The data transmission system as claimed in claim 7, wherein the verification circuit verifies whether each of the plurality of data has a same valid time width.

13. The data transmission system as claimed in claim 12, wherein the verification circuit compares the plurality of data with expected values respectively corresponding to the plurality of data.

14. The data transmission system as claimed in claim 7, wherein the first and second devices respectively include a third external terminal that communicates a result of the comparison by the verification circuit via the second signal line.

15. A data transmission system that performs data transmission,
the system comprising a first device, a second device, and a first signal line connected between the first and second devices to transmit a plurality of serial data, wherein
the second device includes:
a first external terminal connected to the first signal line;
a plurality of first circuits that fetches in parallel the plurality of serial data input via the first external terminal; and
a plurality of second circuits that output the parallel data in the first device as the plurality of serial data, via the first external terminal, and wherein
determining of the data respectively input to the first circuits is controlled by a plurality of first control signals respectively having different phases, a data output timing from the second circuits is controlled by a plurality of second control signals respectively having different phases,
the second device further includes a register that individually changes a transition time of at least either the first control signals or the second control signals,
the first device includes:
a second external terminal connected to the first signal line;
a plurality of third circuits that fetches in parallel the plurality of serial data input via the second external terminal; and
a plurality of fourth circuits that output the parallel data in the second device as the plurality of serial data, via the second external terminal, and wherein
determining of the data respectively input to the third circuits is controlled by a plurality of third control signals respectively having different phases,
an output timing of the data from the fourth circuits is controlled by a plurality of fourth control signals respectively having different phases,
the first device further includes a verification circuit that is connected to the third circuits and verifies the data respectively output by the third circuits,
the first device transmits a result of the verification performed by the verification circuit to the register, and
the second device individually changes the transition time of the first control signals or the second control signals, according to information of the register.

16. The data transmission system as claimed in claim 15, wherein the verification circuit changes a time in which the fourth circuits respectively output data to the second external terminal, and compares the data input from the second external terminal by the third circuits of the first device via the first circuits and the second circuits of the second device with a corresponding expected value.

17. A semiconductor device comprising:
a plurality of first circuits that fetch in parallel a plurality of serial data from an external terminal;
an internal clock generating circuit that generates a plurality of first control signals respectively having different phases; and
an adjusting circuit that changes respective transition times of the first control signals, wherein
the first circuits latches the corresponding serial data at different times, in response to the corresponding first control signals whose transition times have been adjusted by the adjusting circuit, and
the adjusting circuit individually changes respective transition times of the first control signals such that a setup time indicating a time from transition of the data input to the first circuit to the corresponding latch, and a hold time indicating a time from the corresponding latch to transition of the data input to the first circuit are respectively the common setup time and hold time in the first circuits.

18. The semiconductor device as claimed in claim 17, wherein the internal clock generating circuit generates the first control signals respectively having different phases, corresponding to a single transition point of an external clock signal.

19. The semiconductor device as claimed in claim 17, wherein the adjusting circuit includes a register that holds values that change respective transition times of the plural control signals, and
the plurality of data latched by the first circuits at different times are verified in another semiconductor device, and a result of the verification is input to the register.

20. The semiconductor device as claimed in claim 17, further comprising a second circuit that is connected to the external terminal and receives output data from the first plural circuits being input thereto, wherein
  the plurality of data latched by the first circuits at different times are output from the second circuit to other semiconductor devices.

21. The semiconductor device as claimed in claim 20, wherein the adjusting circuit includes a register that holds values which changes respective transition times of the control signals, and
  the plurality of data latched by the first circuits at different times are verified in another semiconductor device via the second circuit, and a result of the verification is input to the register.

22. A semiconductor device comprising:
  a plurality of second circuits that serially output internal parallel data to a single external terminal;
  an internal clock generating circuit that generates a plurality of second control signals respectively having different phases; and
  an adjusting circuit that changes respective transition times of the second control signals, wherein
  the second circuits serially output the corresponding parallel data respectively at different times, in response to the corresponding second control signals whose transition times have been adjusted by the adjusting circuit, and
  the adjusting circuit individually changes respective transition times of the second control signals such that a valid time of the first data and a valid time of the next data output by the second circuits are set to be equal.

23. The semiconductor device as claimed in claim 22, wherein the internal clock generating circuit generates the second control signals respectively having different phases, corresponding to a single transition point of an external clock signal.

24. The semiconductor device as claimed in claim 22, wherein the adjusting circuit includes a register that holds values that change respective transition times of the plural control signals, and
  the plurality of data output by the second circuits are verified outside the semiconductor device, and a result of the verification is input to the register.

25. A semiconductor device comprising:
  a first external terminal and a second external terminal;
  a plurality of first circuits coupled to the first external terminal, each of the first circuits fetches an associated one of a plurality of data supplied from the first external terminal in response to an associated one of a plurality of control signals having different phases; and
  a verification circuit that generates first information for controlling a data supply timing to the first external terminal from outside, based on respective output data from the first circuits, wherein
  the semiconductor device transmits the first information to outside via the second external terminal.

26. The semiconductor device as claimed in claim 25, wherein the first and second external terminals are identical terminals.

27. The semiconductor device as claimed in claim 25, further comprising a plurality of second circuits that are connected to the first external terminal and serially output internal parallel data to the single external terminal respectively in response a plurality of control signals having different phases, wherein
  the verification circuit further outputs second information for controlling a timing of receiving the data transmitted to outside via the first external terminal.

28. A semiconductor device comprising:
  a first external terminal and a second external terminal;
  a data input/output circuit that performs at least one of a first function of fetching data sequentially supplied to the first external terminal from outside and a second function of sequentially transmitting data to outside via the first external terminal; and
  a verification circuit that transmits, to outside via the second external terminal, at least one of first information for controlling a timing of supplying data to the first external terminal from outside and second information for controlling a timing of receiving data transmitted to outside via the first external terminal,
  wherein the first function is a serial-parallel conversion function of fetching in parallel data sequentially supplied from outside, corresponding to a single transition point of an external clock signal, and the second function is a parallel-serial conversion function of sequentially transmitting the internal parallel data to outside, corresponding to a single transition point of an external clock signal.

29. The semiconductor device as claimed in claim 28, wherein the first and second external terminals are identical terminals.

30. The semiconductor device as claimed in claim 28, wherein transition times of a plurality of control signals respectively having different phases corresponding to a single transition point of an external clock signal are changed by the first and second information.

* * * * *